United States Patent
Khlat

(10) Patent No.: US 11,031,909 B2
(45) Date of Patent: Jun. 8, 2021

(54) GROUP DELAY OPTIMIZATION CIRCUIT AND RELATED APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 68 days.

(21) Appl. No.: 16/416,812

(22) Filed: May 20, 2019

(65) Prior Publication Data

US 2020/0177131 A1    Jun. 4, 2020

Related U.S. Application Data

(60) Provisional application No. 62/775,231, filed on Dec. 4, 2018.

(51) Int. Cl.
*H03F 1/02* (2006.01)
*H03F 3/213* (2006.01)
*H03F 1/32* (2006.01)

(52) U.S. Cl.
CPC ........... *H03F 1/0211* (2013.01); *H03F 1/32* (2013.01); *H03F 3/213* (2013.01);
(Continued)

(58) Field of Classification Search
CPC ......... H03F 1/0211; H03F 3/213; H03F 1/32; H03F 2200/451; H03F 2200/375;
(Continued)

(56) References Cited

U.S. PATENT DOCUMENTS 5,838,732 A    11/1998 Carney
6,107,862 A    8/2000 Mukainakano et al.
(Continued)

FOREIGN PATENT DOCUMENTS

EP    3174199 A2    5/2012

OTHER PUBLICATIONS

Notice of Allowance for U.S. Appl. No. 16/122,611, dated Dec. 1, 2020, 9 pages.
(Continued)

*Primary Examiner* — Hieu P Nguyen
(74) *Attorney, Agent, or Firm* — Withrow & Terranova, P.L.L.C.

(57) ABSTRACT

A group delay optimization circuit is provided. The group delay optimization circuit receives a first signal (e.g., a voltage signal) and a second signal (e.g., a current signal). Notably, the first signal and the second signal may experience different group delays that can cause the first signal and the second signal to misalign at an amplifier circuit configured to amplify a radio frequency (RF) signal. The group delay optimization circuit is configured to determine a statistical indicator indicative of a group delay offset between the first signal and the second signal. Accordingly, the group delay optimization circuit may minimize the group delay offset by reducing the statistical indicator to below a defined threshold in one or more group delay optimization cycles. As a result, it may be possible to pre-compensate for the group delay offset in the RF signal, thus helping to improve efficiency and linearity of the amplifier circuit.

20 Claims, 9 Drawing Sheets

(52) U.S. Cl.
CPC .. *H03F 2200/102* (2013.01); *H03F 2200/375* (2013.01); *H03F 2200/451* (2013.01)

(58) Field of Classification Search
CPC ...... H03F 2200/102; H03F 3/19; H03F 3/245; H03F 1/02; H03F 3/189
USPC .......................... 330/296–297, 307, 136, 285
See application file for complete search history.

(56) References Cited

U.S. PATENT DOCUMENTS

| | | | |
|---|---|---|---|
| 6,141,377 A | 10/2000 | Sharper et al. | |
| 6,985,033 B1 | 1/2006 | Shirali et al. | |
| 7,043,213 B2 | 5/2006 | Robinson et al. | |
| 7,471,155 B1 | 12/2008 | Levesque | |
| 7,570,931 B2 | 8/2009 | McCallister et al. | |
| 8,461,928 B2 | 6/2013 | Yahav et al. | |
| 8,493,141 B2 | 7/2013 | Khlat et al. | |
| 8,588,713 B2 | 11/2013 | Khlat | |
| 8,718,188 B2 | 5/2014 | Balteanu et al. | |
| 8,725,218 B2 | 5/2014 | Brown et al. | |
| 8,774,065 B2 | 7/2014 | Khlat et al. | |
| 8,803,603 B2 | 8/2014 | Wimpenny | |
| 8,818,305 B1 | 8/2014 | Schwent et al. | |
| 8,854,129 B2 * | 10/2014 | Wilson ...................... H03F 3/19 330/136 | |
| 8,879,665 B2 | 11/2014 | Xia et al. | |
| 8,913,690 B2 | 12/2014 | Onishi | |
| 8,989,682 B2 | 3/2015 | Ripley et al. | |
| 9,020,451 B2 | 4/2015 | Khlat | |
| 9,041,364 B2 | 5/2015 | Khlat | |
| 9,041,365 B2 | 5/2015 | Kay et al. | |
| 9,055,529 B2 * | 6/2015 | Shih .......................... H03F 3/24 | |
| 9,065,509 B1 | 6/2015 | Yan et al. | |
| 9,069,365 B2 | 6/2015 | Brown et al. | |
| 9,098,099 B2 | 8/2015 | Park et al. | |
| 9,166,538 B2 | 10/2015 | Hong et al. | |
| 9,166,830 B2 | 10/2015 | Camuffo et al. | |
| 9,167,514 B2 | 10/2015 | Dakshinamurthy et al. | |
| 9,197,182 B2 | 11/2015 | Baxter et al. | |
| 9,225,362 B2 | 12/2015 | Drogi et al. | |
| 9,247,496 B2 | 1/2016 | Khlat | |
| 9,263,997 B2 | 2/2016 | Vinayak | |
| 9,270,230 B2 | 2/2016 | Henshaw et al. | |
| 9,270,239 B2 | 2/2016 | Drogi et al. | |
| 9,271,236 B2 | 2/2016 | Drogi | |
| 9,280,163 B2 | 3/2016 | Kay et al. | |
| 9,288,098 B2 | 3/2016 | Yan et al. | |
| 9,298,198 B2 | 3/2016 | Kay et al. | |
| 9,344,304 B1 | 5/2016 | Cohen | |
| 9,356,512 B2 | 5/2016 | Chowdhury et al. | |
| 9,377,797 B2 | 6/2016 | Kay et al. | |
| 9,379,667 B2 | 6/2016 | Khlat et al. | |
| 9,515,622 B2 | 12/2016 | Nentwig et al. | |
| 9,520,907 B2 | 12/2016 | Peng et al. | |
| 9,584,071 B2 | 2/2017 | Khlat | |
| 9,595,869 B2 | 3/2017 | Lerdworatawee | |
| 9,595,981 B2 | 3/2017 | Khlat | |
| 9,596,110 B2 | 3/2017 | Jiang et al. | |
| 9,614,477 B1 | 4/2017 | Rozenblit et al. | |
| 9,634,666 B2 | 4/2017 | Krug | |
| 9,748,845 B1 | 8/2017 | Kotikalapoodi | |
| 9,806,676 B2 | 10/2017 | Balteanu et al. | |
| 9,831,834 B2 | 11/2017 | Balteanu et al. | |
| 9,837,962 B2 | 12/2017 | Mathe et al. | |
| 9,923,520 B1 | 3/2018 | Abdelfattah et al. | |
| 10,003,416 B1 | 6/2018 | Lloyd | |
| 10,090,808 B1 | 10/2018 | Henzler et al. | |
| 10,097,145 B1 | 10/2018 | Khlat et al. | |
| 10,110,169 B2 | 10/2018 | Khesbak et al. | |
| 10,158,329 B1 | 12/2018 | Khlat | |
| 10,158,330 B1 | 12/2018 | Khlat | |
| 10,170,989 B2 | 1/2019 | Balteanu et al. | |
| 10,291,181 B2 | 5/2019 | Kim et al. | |
| 10,326,408 B2 | 6/2019 | Khlat et al. | |
| 10,382,071 B2 | 8/2019 | Rozek et al. | |
| 10,476,437 B2 | 11/2019 | Nag et al. | |
| 2002/0167827 A1 | 11/2002 | Umeda et al. | |
| 2004/0266366 A1 | 12/2004 | Robinson et al. | |
| 2005/0090209 A1 | 4/2005 | Behzad | |
| 2005/0227646 A1 | 10/2005 | Yamazaki et al. | |
| 2005/0232385 A1 | 10/2005 | Yoshikawa et al. | |
| 2006/0240786 A1 | 10/2006 | Liu | |
| 2007/0052474 A1 | 3/2007 | Saito | |
| 2007/0258602 A1 | 11/2007 | Vepsalainen et al. | |
| 2009/0016085 A1 | 1/2009 | Rader et al. | |
| 2009/0045872 A1 | 2/2009 | Kenington | |
| 2009/0191826 A1 | 7/2009 | Takinami et al. | |
| 2010/0308919 A1 | 12/2010 | Adamski et al. | |
| 2011/0074373 A1 | 3/2011 | Lin | |
| 2011/0136452 A1 | 6/2011 | Pratt et al. | |
| 2011/0175681 A1 | 7/2011 | Inamori et al. | |
| 2011/0279179 A1 | 11/2011 | Vice | |
| 2012/0194274 A1 | 8/2012 | Fowers et al. | |
| 2012/0200435 A1 | 8/2012 | Ngo et al. | |
| 2012/0299645 A1 | 11/2012 | Southcombe et al. | |
| 2012/0299647 A1 | 11/2012 | Honjo et al. | |
| 2013/0021827 A1 | 1/2013 | Ye | |
| 2013/0100991 A1 | 4/2013 | Woo | |
| 2013/0130724 A1 | 5/2013 | Kumar Reddy et al. | |
| 2013/0162233 A1 | 6/2013 | Marty | |
| 2013/0187711 A1 | 7/2013 | Goedken et al. | |
| 2013/0200865 A1 | 8/2013 | Wimpenny | |
| 2013/0271221 A1 | 10/2013 | Levesque et al. | |
| 2014/0009226 A1 | 1/2014 | Severson | |
| 2014/0028370 A1 | 1/2014 | Wimpenny | |
| 2014/0028390 A1 | 1/2014 | Davis | |
| 2014/0057684 A1 | 2/2014 | Khlat | |
| 2014/0103995 A1 | 4/2014 | Langer | |
| 2014/0155002 A1 | 6/2014 | Dakshinamurthy et al. | |
| 2014/0184335 A1 | 7/2014 | Nobbe et al. | |
| 2014/0199949 A1 | 7/2014 | Nagode et al. | |
| 2014/0210550 A1 | 7/2014 | Mathe et al. | |
| 2014/0218109 A1 | 8/2014 | Wimpenny | |
| 2014/0235185 A1 | 8/2014 | Drogi | |
| 2014/0266423 A1 | 9/2014 | Drogi et al. | |
| 2014/0266428 A1 | 9/2014 | Chiron et al. | |
| 2014/0315504 A1 | 10/2014 | Sakai et al. | |
| 2014/0361830 A1 | 12/2014 | Mathe et al. | |
| 2015/0048883 A1 | 2/2015 | Vinayak | |
| 2015/0071382 A1 | 3/2015 | Wu et al. | |
| 2015/0098523 A1 | 4/2015 | Lim et al. | |
| 2015/0155836 A1 | 6/2015 | Midya et al. | |
| 2015/0188432 A1 | 7/2015 | Vannorsdel et al. | |
| 2015/0236654 A1 | 8/2015 | Jiang et al. | |
| 2015/0236729 A1 | 8/2015 | Peng et al. | |
| 2015/0280652 A1 | 10/2015 | Cohen | |
| 2015/0333781 A1 | 11/2015 | Alon et al. | |
| 2016/0065137 A1 | 3/2016 | Khlat | |
| 2016/0099687 A1 | 4/2016 | Khlat | |
| 2016/0105151 A1 | 4/2016 | Langer | |
| 2016/0118941 A1 | 4/2016 | Wang | |
| 2016/0126900 A1 | 5/2016 | Shute | |
| 2016/0173031 A1 | 6/2016 | Langer | |
| 2016/0181995 A1 | 6/2016 | Nentwig et al. | |
| 2016/0187627 A1 | 6/2016 | Abe | |
| 2016/0197627 A1 | 7/2016 | Qin et al. | |
| 2016/0226448 A1 | 8/2016 | Wimpenny | |
| 2016/0294587 A1 | 10/2016 | Jiang et al. | |
| 2017/0141736 A1 | 5/2017 | Pratt et al. | |
| 2017/0302183 A1 | 10/2017 | Young | |
| 2017/0317913 A1 | 11/2017 | Kim et al. | |
| 2017/0338773 A1 | 11/2017 | Balteanu et al. | |
| 2018/0013465 A1 | 1/2018 | Chiron et al. | |
| 2018/0048265 A1 | 2/2018 | Nentwig | |
| 2018/0048276 A1 | 2/2018 | Khlat | |
| 2018/0076772 A1 | 3/2018 | Khesbak et al. | |
| 2018/0123453 A1 | 5/2018 | Puggelli et al. | |
| 2018/0288697 A1 | 10/2018 | Camuffo et al. | |
| 2018/0302042 A1 | 10/2018 | Zhang et al. | |
| 2018/0309414 A1 | 10/2018 | Khlat et al. | |
| 2018/0367101 A1 | 12/2018 | Chen et al. | |
| 2019/0044480 A1 | 2/2019 | Khlat | |
| 2019/0068234 A1 | 2/2019 | Khlat et al. | |

(56) References Cited

U.S. PATENT DOCUMENTS

| | | |
|---|---|---|
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0222178 A1 | 7/2019 | Khlat et al. |
| 2019/0238095 A1 | 8/2019 | Khlat |
| 2019/0267956 A1 | 8/2019 | Granger-Jones et al. |
| 2019/0222175 A1 | 10/2019 | Khlat et al. |
| 2020/0007090 A1 | 1/2020 | Khlat et al. |
| 2020/0036337 A1 | 1/2020 | Khlat |
| 2020/0106392 A1 | 4/2020 | Khlat et al. |
| 2020/0136561 A1 | 4/2020 | Khlat et al. |
| 2020/0136563 A1 | 4/2020 | Khlat |
| 2020/0136575 A1 | 4/2020 | Khlat et al. |
| 2020/0144966 A1 | 5/2020 | Khlat |
| 2020/0153394 A1 | 5/2020 | Khlat et al. |
| 2020/0204116 A1 | 6/2020 | Khlat |
| 2020/0228063 A1 | 7/2020 | Khlat |
| 2020/0259456 A1 | 8/2020 | Khlat |
| 2020/0259685 A1 | 8/2020 | Khlat |
| 2020/0266766 A1 | 8/2020 | Khlat et al. |

OTHER PUBLICATIONS

Quayle Action for U.S. Appl. No. 16/589,940, dated Dec. 4, 2020, 8 pages.
Non-Final Office Action for U.S. Appl. No. 14/836,634, dated May 16, 2016, 9 pages.
Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.
Notice of Allowance for U.S. Appl. No. 16/354,234, dated Apr. 24, 2020, 9 pages.
Non-Final Office Action for U.S. Appl. No. 16/246,859, dated Apr. 28, 2020, 9 pages.
Corrected Notice of Allowability for U.S. Appl. No. 15/888,300, dated May 13, 2020, 7 pages.
Notice of Allowance for U.S. Appl. No. 16/155,127, dated Jun. 1, 2020, 8 pages.
Final Office Action for U.S. Appl. No. 16/174,535, dated Jul. 1, 2020, 7 pages.
Non-Final Office Action for U.S. Appl. No. 16/284,023, dated Jun. 24, 2020, 7 pages.
Non-Final Office Action for U.S. Appl. No. 16/435,940, dated Jul. 23, 2020, 6 pages.
Final Office Action for U.S. Appl. No. 15/888,300, dated Feb. 15, 2019, 15 pages.
Final Office Action for U.S. Appl. No. 16/122,611, dated Sep. 18, 2020, 17 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Notice of Allowance for U.S. Appl. No. 16/246,859, dated Sep. 18, 2020, 8 pages.
Final Office Action for U.S. Appl. No. 16/284,023, dated Nov. 3, 2020, 7 pages.
Quayle Action for U.S. Appl. No. 16/421,905, dated Aug. 25, 2020, 5 pages.
Non-Final Office Action for U.S. Appl. No. 16/774,060, dated Aug. 17, 2020, 6 pages.
Non-Final Office Action for U.S. Appl. No. 16/514,051, dated Nov. 13, 2020, 9 pages.
Notice of Allowance for U.S. Appl. No. 16/122,611, dated Jan. 13, 2021, 8 pages.
Notice of Allowance for U.S. Appl. No. 16/284,023, dated Jan. 19, 2021, 7 pages.
Non-Final Office Action for U.S. Appl. No. 16/689,236 dated Mar. 2, 2021, 15 pages.
Notice of Allowance for U.S. Appl. No. 16/435,940, dated Dec. 21, 2020, 7 pages.
Notice of Allowance for U.S. Appl. No. 16/774,060, dated Feb. 3, 2021, 7 pages.
Notice of Allowance for U.S. Appl. No. 16/590,790, dated Jan. 27, 2021, 7 pages.
Notice of Allowance for U.S. Appl. No. 16/661,061, dated Feb. 10, 2021, 7 pages.
Notice of Allowance for U.S. Appl. No. 16/122,611, dated Apr. 1, 2021, 8 pages.
Non-Final Office Action for U.S. Appl. No. 16/582,471, dated Mar. 24, 2021, 11 pages.

* cited by examiner

US 11,031,909 B2

GROUP DELAY OPTIMIZATION CIRCUIT AND RELATED APPARATUS

RELATED APPLICATIONS

This application claims the benefit of U.S. provisional patent application Ser. No. 62/775,231, filed on Dec. 4, 2018, which is incorporated herein by reference in its entirety.

FIELD OF THE DISCLOSURE

The technology of the disclosure relates generally to envelope tracking (ET) power management in wireless communication devices.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE). To achieve the higher data rates in mobile communication devices, sophisticated power amplifiers (PAs) may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking is a power management technology designed to improve efficiency levels of PAs to help reduce power consumption and thermal dissipation in mobile communication devices. As the name suggests, envelope tracking employs a system that keeps track of the amplitude envelope of the RF signals communicated by mobile communication devices. The envelope tracking system constantly adjusts supply voltages applied to the PAs to ensure that the PAs are operating at a higher efficiency for a given instantaneous output power requirement of the RF signals.

However, the envelope tracking system can only maintain good linearity and high efficiency up to an inherent bandwidth limit. In the advent of fifth-generation new radio (5G-NR) technology, the RF signals may be modulated with a higher bandwidth (e.g., >100 MHz) than the inherent bandwidth limit of the envelope tracking system, thus reducing linearity and efficiency of the envelope tracking system. As such, it may be desirable to improve linearity and efficiency of the envelope tracking system to support the 5G-NR technology.

SUMMARY

Aspects disclosed in the detailed description include a group delay optimization circuit and related apparatus. In examples discussed herein, the group delay optimization circuit receives a first signal (e.g., a voltage signal) and a second signal (e.g., a current signal). Notably, the first signal and the second signal may experience different group delays that can cause the first signal and the second signal to misalign at an amplifier circuit configured to amplify a radio frequency (RF) signal. In this regard, the group delay optimization circuit is configured to determine a statistical indicator indicative of a group delay offset between the first signal and the second signal. Accordingly, the group delay optimization circuit may minimize the group delay offset by reducing the statistical indicator to below a defined threshold in one or more group delay optimization cycles. As a result, it may be possible to pre-compensate for the group delay offset in the RF signal, thus helping to improve efficiency and linearity of the amplifier circuit.

In one aspect, a group delay optimization circuit is provided. The group delay optimization circuit includes a first input node configured to receive a first signal. The group delay optimization circuit also includes a second input node configured to receive a second signal. The group delay optimization circuit also includes a control circuit. The control circuit is configured to sample a first selected signal among the first signal and the second signal in a delay estimation window corresponding to a second selected signal among the first signal and the second signal to generate a number of amplitude samples of the first selected signal. The control circuit is also configured to determine a statistical indicator indicative of a group delay offset between the first signal and the second signal based on the amplitude samples. The control circuit is also configured to reduce the statistical indicator to below a defined threshold in one or more group delay optimization cycles to minimize the group delay offset between the first signal and the second signal.

In another aspect, an ET apparatus is provided. The ET apparatus includes an amplifier circuit configured to receive a signal corresponding to a time-variant signal envelope from a coupled transceiver circuit and amplify the signal based on an ET voltage signal. The ET apparatus includes an ET integrated circuit (ETIC). The ETIC is configured to generate the ET voltage signal based on an ET target voltage signal. The ETIC is also configured to generate a sense current signal corresponding to a time-variant current envelope proportionally related to the time-variant signal envelope. The ET apparatus also includes a group delay optimization circuit. The group delay optimization circuit includes a first input node configured to receive a selected voltage signal among the ET target voltage signal and the ET voltage signal. The group delay optimization circuit also includes a second input node configured to receive the sense current signal. The group delay optimization circuit also includes a control circuit. The control circuit is configured to sample a first selected signal among the sense current signal and the selected voltage signal in a delay estimation window corresponding to a second selected signal among the sense current signal and the selected voltage signal to generate a number of amplitude samples of the first selected signal. The control circuit is also configured to determine a statistical indicator indicative of a group delay offset between the selected voltage signal and the sense current signal based on the amplitude samples. The control circuit is also configured to reduce the statistical indicator to below a defined threshold in one or more group delay optimization cycles to minimize the group delay offset between the selected voltage signal and the sense current signal.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1A:
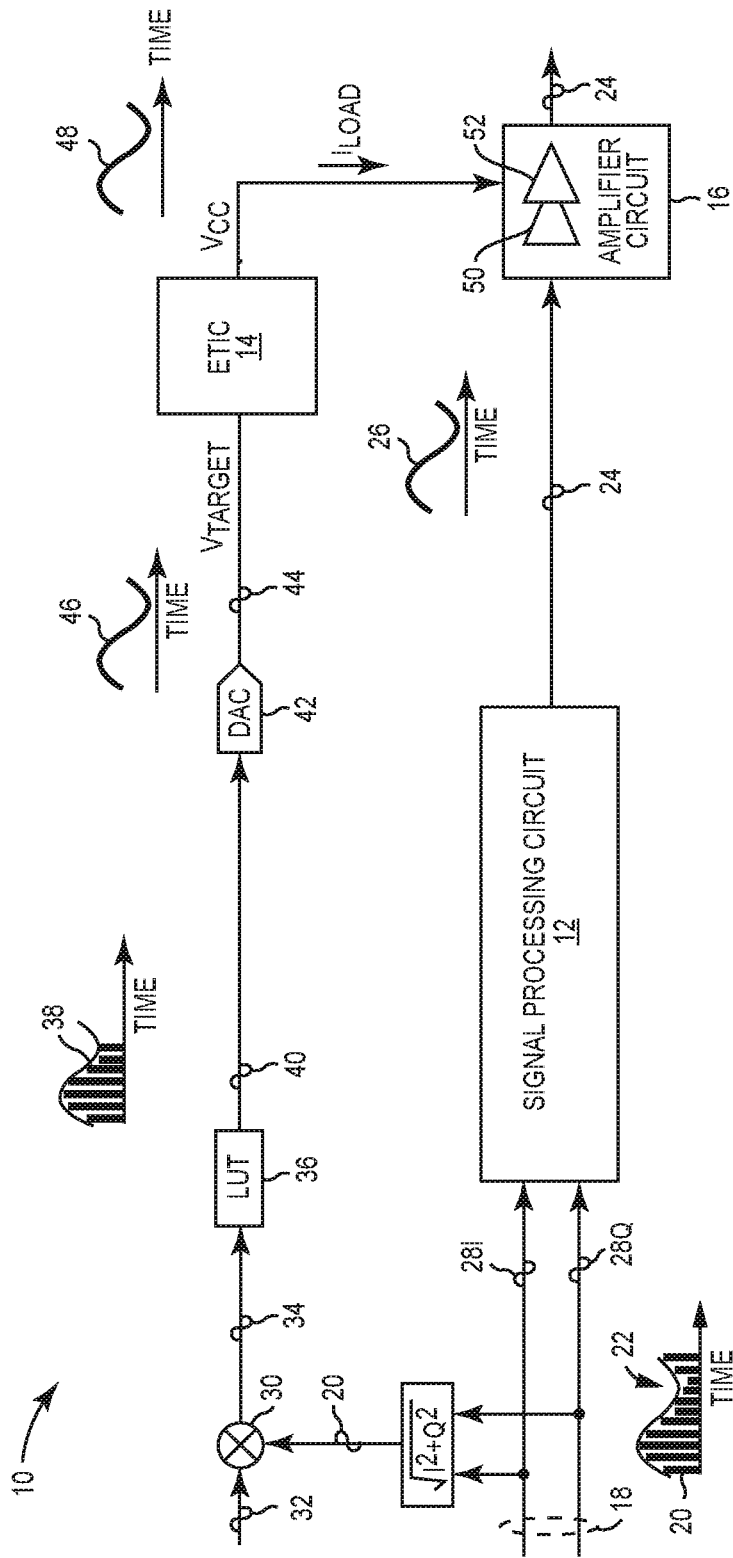
FIG. 1A is a schematic diagram of an exemplary existing envelope tracking (ET) amplifier apparatus that can experience degraded overall linearity performance as a result of inherent processing and/or propagation delays of the existing ET apparatus.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a group delay optimization circuit and related apparatus. In examples discussed herein, the group delay optimization circuit receives a first signal (e.g., a voltage signal) and a second signal (e.g., a current signal). Notably, the first signal and the second signal may experience different group delays that can cause the first signal and the second signal to misalign at an amplifier circuit configured to amplify a radio frequency (RF) signal. In this regard, the group delay optimization circuit is configured to determine a statistical indicator indicative of a group delay offset between the first signal and the second signal. Accordingly, the group delay optimization circuit may minimize the group delay offset by reducing the statistical indicator to below a defined threshold in one or more group delay optimization cycles. As a result, it may be possible to pre-compensate for the group delay offset in the RF signal, thus helping to improve efficiency and linearity of the amplifier circuit.

Figure 1B:
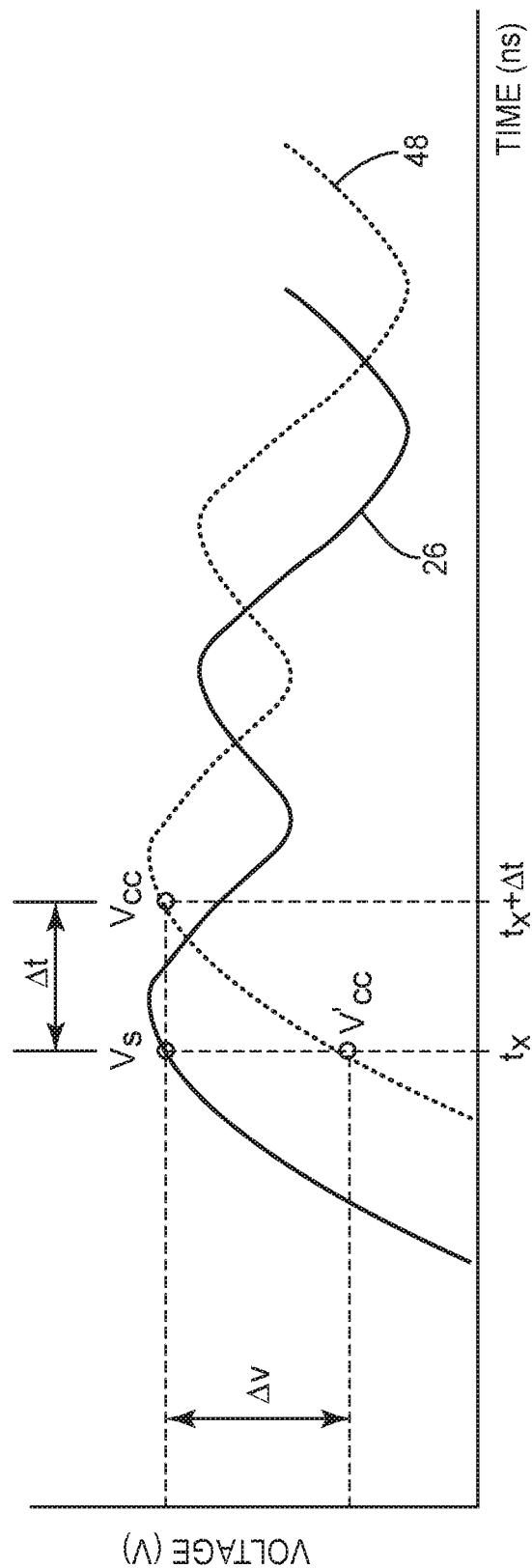
FIG. 1B is a graphic diagram providing an exemplary illustration of a temporal misalignment between a time-variant voltage envelope and a time-variant signal envelope that can occur in the existing ET apparatus of FIG. 1A.
Figure 1C:
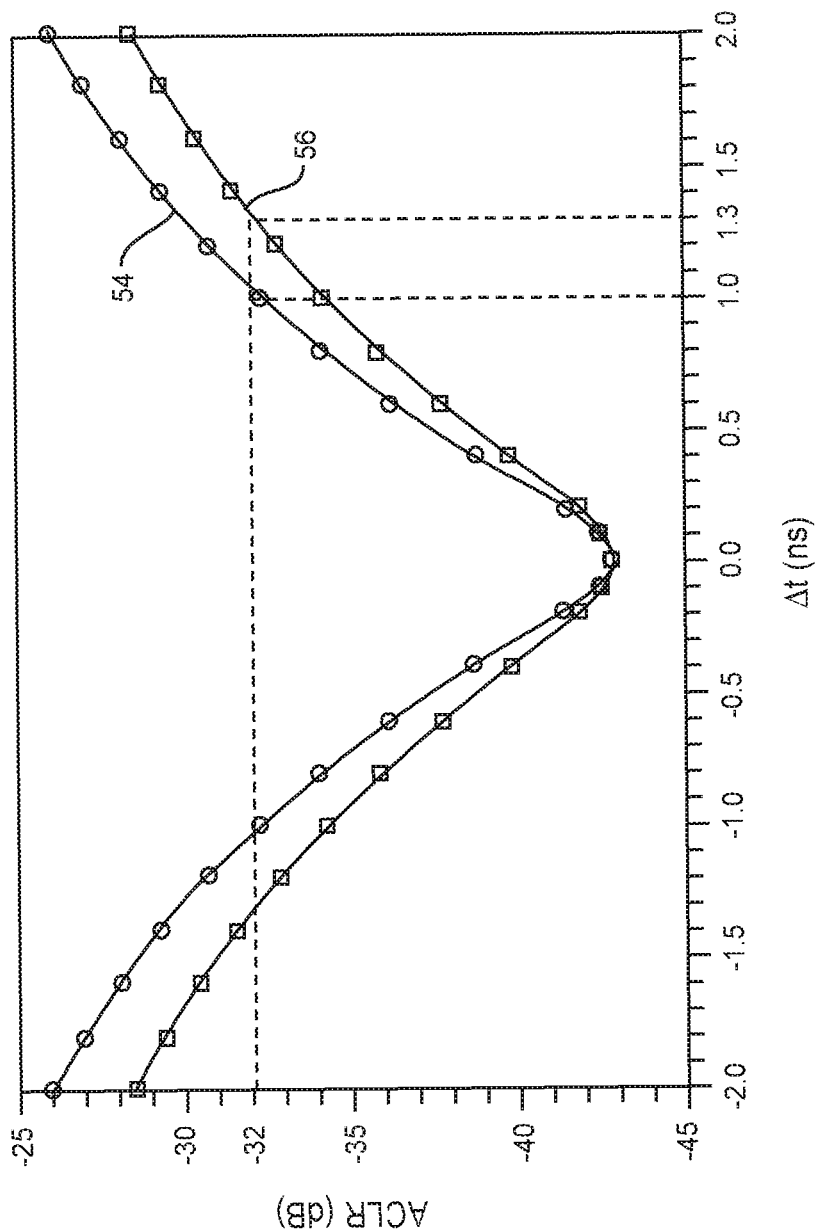
FIG. 1C is a graphic diagram providing an exemplary illustration of how a temporal delay can affect adjacent channel leakage ratio (ACLR) of an amplifier circuit in the existing ET apparatus of FIG. 1A.

Before discussing a group delay optimization circuit of the present disclosure, a brief overview of an existing ET apparatus that may experience degraded overall linearity performance as a result of inherent temporal delay associated with the existing ET apparatus is first provided with reference to FIGS. 1A-1C. A discussion of how a group delay variation can affect amplitude variation of a voltage signal and a current signal is then provided with reference to FIG. 2 to help establish a basis for using a statistical means to determine the optimized delay offset between the current signal and the voltage signal. The discussion of specific exemplary aspects of a group delay optimization circuit of the present disclosure starts below with reference to FIG. 3.

FIG. 1A is a schematic diagram of an exemplary existing ET apparatus 10 that can experience a degraded overall linearity performance as a result of inherent processing and/or propagation delays of the existing ET apparatus 10. The existing ET apparatus 10 includes a signal processing circuit 12, an ET integrated circuit (ETIC) 14, and an amplifier circuit 16. The signal processing circuit 12 receives a digital signal 18 that includes a number of time-variant digital signal amplitudes 20 representing a time-variant digital signal envelope 22. The phrase "time-variant" is used hereinafter to refer to a parameter (e.g., amplitude, voltage, power, etc.) that changes (e.g., increases or decreases) over time.

The signal processing circuit 12 is configured to convert the digital signal 18 into an RF signal 24 having a time-variant signal envelope 26 formed based on the time-variant digital signal envelope 22. In this regard, the time-variant digital signal envelope 22, which is defined by the time-variant digital signal amplitudes 20, can be seen as a digital representation of the time-variant signal envelope 26.

The digital signal 18 may be modulated to include a digital in-phase signal 28I, which has a number of time-variant in-phase amplitudes I, and a digital quadrature signal 28Q, which has a number of time-variant quadrature amplitudes Q. In this regard, each of the time-variant digital signal amplitudes 20 of the digital signal 18 can be expressed as $\sqrt{I^2+Q^2}$.

The existing ET apparatus 10 includes a mixer 30 that combines the time-variant digital signal amplitudes 20 with a digital voltage reference signal 32 to generate a digital target voltage reference signal 34. In this regard, the digital target voltage reference signal 34 is associated with the time-variant digital signal envelope 22 and, therefore, the time-variant digital signal amplitudes 20.

The existing ET apparatus 10 includes lookup table (LUT) circuitry 36 (denoted as "LUT" in FIG. 1A), which may store a number of predetermined target voltage amplitude values corresponding to the time-variant digital signal amplitudes 20. In this regard, the LUT circuitry 36 converts the time-variant digital signal amplitudes 20 into a number of time-variant digital target voltage amplitudes 38 and associates the time-variant digital target voltage amplitudes 38 with a digital target voltage signal 40. As a result of such digital conversion, the time-variant digital target voltage amplitudes 38 may be distorted. For example, the LUT circuitry 36 can be non-strictly monotonic. As a result, a digital target voltage amplitude among the time-variant digital target voltage amplitudes 38 can become higher or lower than a corresponding digital signal amplitude among the time-variant digital signal amplitudes 20.

The existing ET apparatus 10 includes a voltage digital-to-analog converter (DAC) 42 configured to convert the digital target voltage signal 40 into a target voltage signal 44 having a time-variant target voltage envelope 46 formed based on the time-variant digital target voltage amplitudes 38. The voltage DAC 42 is configured to provide the target voltage signal 44 to the ETIC 14.

The ETIC 14 receives the target voltage signal 44 having the time-variant target voltage envelope 46. The time-variant target voltage envelope 46 may represent an ET target voltage $V_{TARGET}$ for the ETIC 14. The ETIC 14 is configured to generate an ET voltage $V_{CC}$ having a time-variant ET voltage envelope 48 that tracks the time-variant target voltage envelope 46. The ET voltage $V_{CC}$ is a time-variant ET voltage formed based on the ET target voltage $V_{TARGET}$. Accordingly, the ET voltage $V_{CC}$ tracks the ET target voltage $V_{TARGET}$.

The amplifier circuit 16 is coupled to the signal processing circuit 12 to receive the RF signal 24 having the time-variant signal envelope 26. The amplifier circuit 16 is also coupled to the ETIC 14 to receive the ET voltage $V_{CC}$ corresponding to the time-variant ET voltage envelope 48. The amplifier circuit 16 is configured to amplify the RF signal 24 based on the ET voltage $V_{CC}$. The amplifier circuit 16 may appear to the ETIC 14 as a current source and induce a load current $I_{LOAD}$ in response to receiving the ET voltage $V_{CC}$. In case the time-variant signal envelope 26 corresponds to a higher peak-to-average ratio (PAR), the ETIC 14 may have to source at least a portion of the load current $I_{LOAD}$ to keep track of the time-variant signal envelope 26. In this regard, to avoid amplitude clipping in the RF signal 24, the load current $I_{LOAD}$ needs to rise and fall from time to time in accordance to the time-variant signal envelope 26 of the RF signal 24. Further, to maintain linearity and efficiency in the amplifier circuit 16, the time-variant ET voltage envelope 48 of the ET voltage $V_{CC}$ also needs to align closely with the time-variant signal envelope 26 at the amplifier circuit 16.

However, the signal processing circuit 12, the LUT circuitry 36, the voltage DAC 42, and the ETIC 14 may each incur processing and/or propagation delays. In addition, the amplifier circuit 16 may be a multi-stage amplifier including a driver stage 50 and an output stage 52 that also incur respective processing and/or propagation delays. As a result, the time-variant ET voltage envelope 48 may be out of alignment with the time-variant signal envelope 26 at the amplifier circuit 16. Hereinafter, the phrase "group delay" refers generally to a sum of all delays (processing and propagation) related to generating the ET voltage $V_{CC}$ or providing the RF signal 24 to the amplifier circuit 16.

In this regard, FIG. 1B is a graphic diagram providing an exemplary illustration of a temporal misalignment between the time-variant ET voltage envelope 48 and the time-variant signal envelope 26 of FIG. 1A. Elements of FIG. 1A are referenced in conjunction with FIG. 1B and will not be re-described herein.

If the time-variant signal envelope 26 and the time-variant ET voltage envelope 48 are perfectly aligned, an instantaneous amplitude of the RF signal 24 (not shown), which is represented by a voltage $V_S$, would substantially equal the ET voltage $V_{CC}$ at time $t_x$. However, as shown in FIG. 1B, the time-variant signal envelope 26 lags behind the time-variant ET voltage envelope 48 by a temporal delay $\Delta t$. As such, at time $t_x$, the amplifier circuit 16 (not shown) receives a lower ET voltage $V'_{CC}$, instead of the ET voltage $V_{CC}$. In this regard, the time-variant ET voltage envelope 48 deviates from the time-variant signal envelope 26 by a voltage differential $\Delta v$ at time $t_x$. Consequently, the amplifier circuit 16 may suffer degraded linearity performance.

In a non-limiting example, the linearity performance of the amplifier circuit 16 can be measured by an adjacent channel leakage ratio (ACLR). The ACLR represents a ratio between in-band power and out-of-band leakage power. In this regard, a higher ACLR indicates a better linearity performance of the amplifier circuit 16. FIG. 1C is a graphic diagram providing an exemplary illustration of how the temporal delay Δt of FIG. 1B can affect the ACLR of the amplifier circuit 16 of FIG. 1A. Elements of FIGS. 1A and 1B are referenced in conjunction with FIG. 1C and will not be re-described herein.

FIG. 1C includes a first ACLR curve 54 and a second ACLR curve 56. In a non-limiting example, the first ACLR curve 54 corresponds to an RF signal (e.g., the RF signal 24) modulated at 100 MHz bandwidth and the second ACLR curve 56 corresponds to an RF signal (e.g., the RF signal 24) modulated at 60 MHz bandwidth. As shown in FIG. 1C, the first ACLR curve 54 has a steeper slope compared to the second ACLR curve 56. In this regard, to achieve −32 dB ACLR, for example, the existing ET apparatus 10 is confined to a delay budget of approximately 1.0 nanosecond (ns) when the RF signal 24 is modulated at 100 MHz bandwidth. In contrast, the existing ET apparatus 10 would be subject to a more relaxed delay budget of approximately 1.3 ns for the same −32 dB ACLR when the RF signal 24 is modulated at 60 MHz bandwidth.

Notably, the RF signal 24 may be a long-term evolution (LTE) signal, which is typically modulated at up to 60 MHz modulation bandwidth or a fifth-generation new-radio (5G-NR) signal that is often modulated at more than 100 MHz modulation bandwidth. In this regard, the existing ET apparatus 10 must adhere to a more stringent delay budget to achieve a desirable ACLR at the amplifier circuit 16 for communicating the RF signal 24 in a 5G-NR system.

With reference back to FIG. 1B, to mitigate linearity degradation and achieve the desirable ACLR at the amplifier circuit 16, it is necessary to reduce the temporal delay Δt between the time-variant ET voltage envelope 48 and the time-variant signal envelope 26. However, it may be difficult to do so adequately in the existing ET apparatus 10 to satisfy the more stringent delay budget required for communicating a 5G-NR signal modulated at the higher modulation bandwidth (e.g., >100 MHz). As such, it may be desirable to improve delay tolerance of the existing ET apparatus 10 to reduce linearity degradation caused by temporal misalignment between the time-variant ET voltage envelope 48 and the time-variant signal envelope 26.

Figure 2:
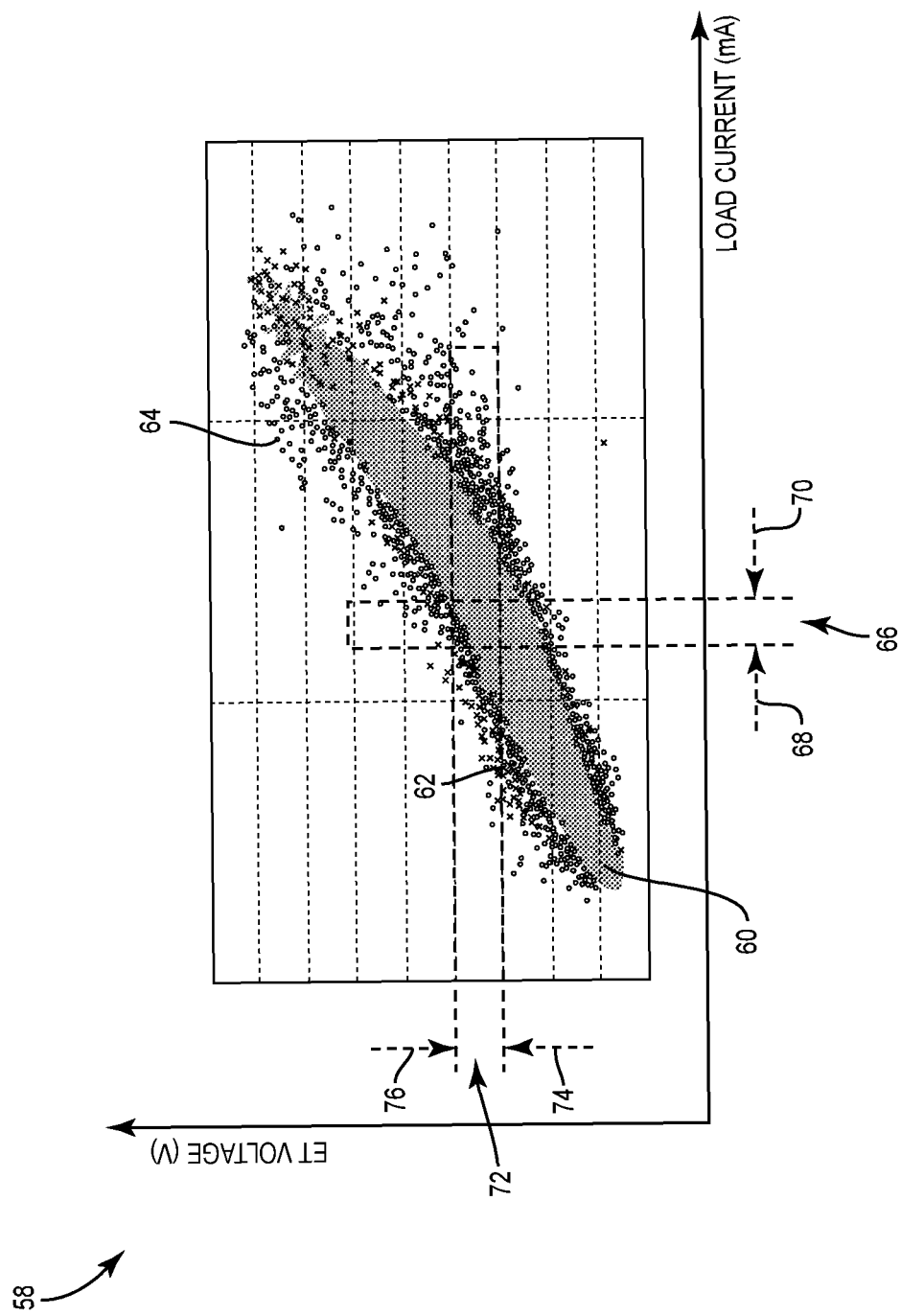
FIG. 2 is a graphical diagram providing an exemplary illustration of amplitude variations of an ET voltage and a load current as a result of group delay variations between a time-variant ET voltage envelope and a time-variant signal envelope in the existing ET apparatus of FIG. 1A.

Notably, the temporal delay Δt between the time-variant ET voltage envelope 48 and the time-variant signal envelope 26 can cause fluctuations in the ET voltage $V_{CC}$ and the load current $I_{LOAD}$. In this regard, FIG. 2 is a graphic diagram 58 providing an exemplary illustration of amplitude variations of the ET voltage $V_{CC}$ and the load current $I_{LOAD}$ as a result of group delay variations between the time-variant ET voltage envelope 48 and the time-variant signal envelope 26 in the existing ET apparatus 10 of FIG. 1A. Elements in FIG. 1A are referenced in conjunction with FIG. 2 and will not be re-described herein.

In the graphic diagram 58, a band region 60 represents distribution of the ET voltage $V_{CC}$ and the load current $I_{LOAD}$ when the time-variant ET voltage envelope 48 is aligned with the time-variant signal envelope 26. The graphic diagram 58 includes a number of first dots 62 and a number of second dots 64. The first dots 62 indicate distributions of the ET voltage $V_{CC}$ and the load current $I_{LOAD}$ when the time-variant ET voltage envelope 48 is ahead of the time-variant signal envelope 26. The second dots 64 indicate distributions of the ET voltage $V_{CC}$ and the load current $I_{LOAD}$ when the time-variant ET voltage envelope 48 is behind the time-variant signal envelope 26.

An important observation can be made from the graphic diagram 58. When the time-variant ET voltage envelope 48 is aligned with the time-variant signal envelope 26, the distribution of the ET voltage $V_{CC}$ and the load current $I_{LOAD}$ may be close to a statistical mean (e.g., in the band region 60). In contrast, when the time-variant ET voltage envelope 48 is misaligned from the time-variant signal envelope 26, the distribution of the ET voltage $V_{CC}$ and the load current $I_{LOAD}$ may deviate from statistical mean, such as the first dots 62 or the second dots 64.

In this regard, it may be possible to correlate a defined statistical indicator (e.g., standard deviation) indicative of the distribution of the ET voltage $V_{CC}$ and/or the load current $I_{LOAD}$ with a group delay offset between the time-variant ET voltage envelope 48 and the time-variant signal envelope 26. As discussed below in the exemplary aspects of the present disclosure, it may be possible to optimize the group delay offset between the time-variant ET voltage envelope 48 and the time-variant signal envelope 26 by minimizing the defined statistical indicator.

In one non-limiting example, it is possible to define a current-related delay estimation window 66 based on a lower current threshold 68 and an upper current threshold 70 of the load current $I_{LOAD}$. The current-related delay estimation window 66 may be determined (e.g., via simulation) to correspond to higher voltage sensitivity. Accordingly, it may be possible to sample the ET voltage $V_{CC}$ in the current-related delay estimation window 66 to determine a voltage-related statistical indicator $\sigma_v$ indicative of the distribution of the ET voltage $V_{CC}$. Since the ET voltage $V_{CC}$ is generated based on the ET target voltage $V_{TARGET}$, it may also be possible to sample the ET target voltage $V_{TARGET}$ in the current-related delay estimation window 66 to determine the voltage-related statistical indicator $\sigma_v$ indicative of the distribution of the ET voltage $V_{CC}$. Thus, by minimizing the voltage-related statistical indicator $\sigma_v$ associated with the ET voltage $V_{CC}$, it may be possible to optimize the group delay offset between the time-variant ET voltage envelope 48 and the time-variant signal envelope 26.

In another non-limiting example, it is possible to define a voltage-related delay estimation window 72 based on a lower voltage threshold 74 and an upper voltage threshold 76 of the ET voltage $V_{CC}$ (or the ET target voltage $V_{TARGET}$). The voltage-related delay estimation window 72 may be determined (e.g., via simulation) to correspond to higher current sensitivity. Accordingly, it may be possible to sample the load current $I_{LOAD}$ in the voltage-related delay estimation window 72 to determine a current-related statistical indicator $\sigma_i$ indicative of the distribution of the load current $I_{LOAD}$. Thus, by minimizing the current-related statistical indicator $\sigma_i$ associated with the load current $I_{LOAD}$, it may be possible to optimize the group delay offset between the time-variant ET voltage envelope 48 and the time-variant signal envelope 26.

Figure 3:
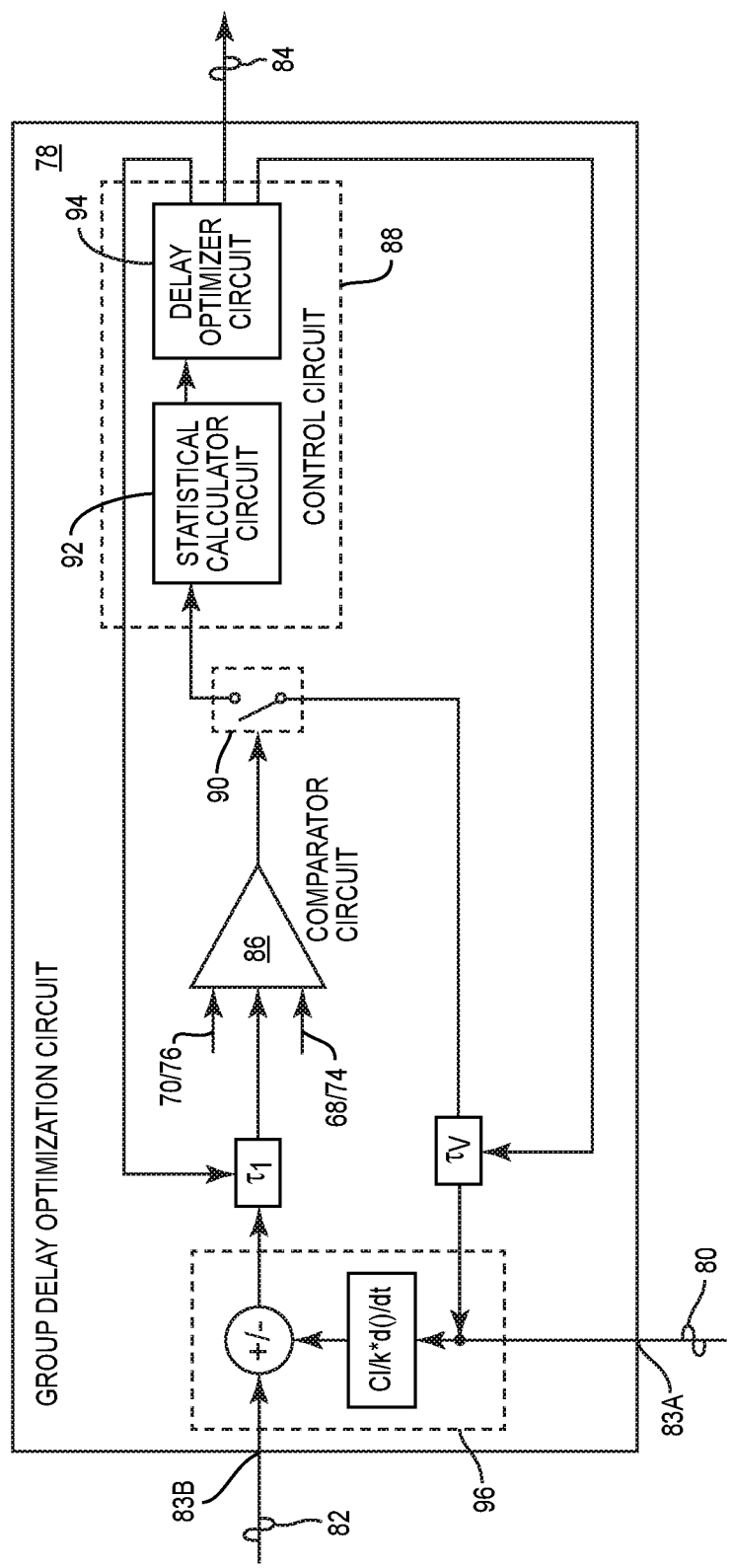
FIG. 3 is a schematic diagram of an exemplary group delay optimization circuit configured according to an embodiment of the present disclosure to optimize a group delay offset between a voltage signal and a current signal by minimizing a statistical indicator indicative of a statistical distribution of the voltage signal and/or the current signal.

In this regard, FIG. 3 is a schematic diagram of an exemplary group delay optimization circuit 78 configured according to an embodiment of the present disclosure to minimize a group delay offset between a voltage signal 80 (also referred to as "a first signal") and a current signal 82 (also referred to as "a second signal") by minimizing a statistical indicator $\sigma$ indicative of a statistical distribution of the voltage signal 80 and/or the current signal 82. Common elements between FIGS. 2 and 3 are shown therein with common element numbers and will not be re-described herein.

The group delay optimization circuit 78 may include a first input node 83A and a second input node 83B configured to receive the voltage signal 80 and the current signal 82, respectively. In a non-limiting example, the voltage signal 80 can be the ET voltage $V_{CC}$ or the ET target voltage $V_{TARGET}$ as illustrated in FIG. 1A and the current signal 82 can be the load current $I_{LOAD}$ or a derivative signal proportionally related to the load current $I_{LOAD}$. Notably, the voltage signal 80 may correspond to a voltage group delay $T_v$ and the current signal 82 may correspond to a current group delay $T_i$. Accordingly, the group delay offset between the voltage signal 80 and the current signal 82 corresponds to a differential between the voltage group delay $T_v$ and the current group delay $T_i$ (e.g., $T_v$–$T_i$ or $T_i$–$T_v$). Thus, it may be possible to adjust (increase or decrease) the group delay offset by adjusting (increase or decrease) the voltage group delay $T_v$ and/or the current group delay $T_i$.

In one embodiment, the group delay optimization circuit 78 can be configured to sample the voltage signal 80 (also known as "a first selected signal among the voltage signal 80 and the current signal 82") in the current-related delay estimation window 66, which corresponds to the current signal 82 (also known as "a second selected signal among the voltage signal 80 and the current signal 82"), to generate a number of voltage amplitude samples of the voltage signal 80. Accordingly, the group delay optimization circuit 78 can determine a voltage-related statistical indicator $\sigma_v$ based on the voltage amplitude samples. The voltage-related statistical indicator $\sigma_v$ may be determined based on any of the equations (Eq. 1.1-1.3) below.

$$\sigma_v = \sum_{i=1}^{N} (x_i - \mu)^2 \qquad (Eq.\ 1.1)$$

$$\sigma_v = \frac{1}{N}\sum_{i=1}^{N} (x_i - \mu)^2 \qquad (Eq.\ 1.2)$$

$$\sigma_v = \sqrt{\frac{1}{N}\sum_{i=1}^{N} (x_i - \mu)^2} \qquad (Eq.\ 1.3)$$

In the equations (Eq. 1.1-1.3) above, "N" represents a count of the voltage amplitude samples, "$x_i$" represents any of the voltage amplitude samples, and "$\mu$" represents a mean value of the voltage amplitude samples. The group delay optimization circuit 78 may be configured to perform one or more group delay optimization cycles to minimize the group delay offset $\sigma$. In a non-limiting example, in each of the group delay optimization cycles, the group delay optimization circuit 78 may adjust the group delay offset between the voltage signal 80 and the current signal 82. Accordingly, the group delay optimization circuit 78 may re-sample the voltage signal 80 to generate the voltage amplitude samples and re-determine voltage-related statistical indicator $\sigma_v$ based on the voltage amplitude samples. The group delay optimization circuit 78 may be configured to stop the group delay optimization cycles as soon as the voltage-related statistical indicator $\sigma_v$ is below a defined threshold. Hereinafter, the group delay offset that causes the voltage-related statistical indicator $\sigma_v$ to be below the defined threshold is referred to as an optimized group delay offset. Accordingly, the group delay optimization circuit 78 may output a group delay correction signal 84 indicative of the optimized group delay offset.

In another embodiment, the group delay optimization circuit 78 can be configured to sample the current signal 82 (also known as "a first selected signal among the voltage signal 80 and the current signal 82") in the voltage-related delay estimation window 72, which corresponds to the voltage signal 80 (also known as "a second selected signal among the voltage signal 80 and the current signal 82"), to generate a number of current amplitude samples of the current signal 82. Accordingly, the group delay optimization circuit 78 can determine a current-related statistical indicator $\sigma_i$ based on the current amplitude samples. The current-related statistical indicator $\sigma_i$ may be determined based on any of the equations (Eq. 2.1-2.3) below.

$$\sigma_i = \sum_{i=1}^{N} (x_i - \mu)^2 \qquad (Eq.\ 2.1)$$

$$\sigma_i = \frac{1}{N}\sum_{i=1}^{N} (x_i - \mu)^2 \qquad (Eq.\ 2.2)$$

$$\sigma_i = \sqrt{\frac{1}{N}\sum_{i=1}^{N} (x_i - \mu)^2} \qquad (Eq.\ 2.3)$$

Accordingly, the group delay optimization circuit 78 may perform the group delay optimization cycles to minimize the group delay offset to below the defined threshold and subsequently output the group delay correction signal 84 indicative of the optimized group delay offset.

The group delay optimization circuit 78 includes a comparator circuit 86 configured to receive the voltage signal 80 and the current signal 82. The group delay optimization circuit 78 also includes a control circuit 88. In a non-limiting example, the comparator circuit 86 is coupled to the control circuit 88 via a switch circuit 90. Accordingly, the comparator circuit 86 can be configured to activate or deactivate the control circuit 88 via the switch circuit 90.

In one embodiment, the comparator circuit 86 may be configured to compare the current signal 82 against the lower current threshold 68 and the upper current threshold 70 to determine whether the current signal 82 falls within the current-related delay estimation window 66. If the comparator circuit 86 determines that the current signal 82 falls within the current-related delay estimation window 66, the comparator circuit 86 may control the switch circuit 90 to activate the control circuit 88 to determine the optimized group delay offset between the voltage signal 80 and the current signal 82 by sampling the voltage signal 80, determining the voltage-related statistical indicator $\sigma_v$, and minimizing the voltage-related statistical indicator $\sigma_v$ to below the defined threshold.

In another embodiment, the comparator circuit 86 may be configured to compare the voltage signal 80 against the lower voltage threshold 74 and the upper voltage threshold 76 to determine whether the voltage signal 80 falls within the voltage-related delay estimation window 72. If the comparator circuit 86 determines that the voltage signal 80 falls within the voltage-related delay estimation window 72, the comparator circuit 86 may control the switch circuit 90 to activate the control circuit 88 to determine the optimized group delay offset between the voltage signal 80 and the current signal 82 by sampling the current signal 82, determining the current-related statistical indicator $\sigma_i$, and minimizing the current-related statistical indicator $\sigma_i$ to below the defined threshold.

In a non-limiting example, the control circuit 88 includes a statistical calculator circuit 92 and a delay optimizer circuit 94. The statistical calculator circuit 92 may be configured to sample the voltage signal 80 and/or the current signal 82 in the current-related delay estimation window 66 and/or the voltage-related delay estimation window 72. Accordingly, the statistical calculator circuit 92 may be configured to determine the voltage-related statistical indicator $\sigma_v$ based on the voltage amplitude samples of the voltage signal 80 and/or the current-related statistical indicator $\sigma_i$ based on the current amplitude samples of the current signal 82. The delay optimizer circuit 94 may be configured to determine the optimized group delay offset between the voltage signal 80 and the current signal 82 by performing the group delay optimization cycles to reduce the voltage-related statistical indicator $\sigma_v$ and/or the current-related statistical indicator $\sigma_i$ to below the defined threshold. Notably, the delay optimizer circuit 94 may be configured to adjust (increase or decrease) the group delay offset in each of the group delay optimization cycles by adjusting the voltage group delay $T_v$ and/or the current group delay $T_i$.

The group delay optimization circuit 78 may further include a current subtraction circuit 96. In a non-limiting example, the current subtraction circuit 96 can be configured to remote an unwanted current signal(s) from the current signal 82 prior to providing the current signal 82 to the comparator circuit 86.

Figure 4:
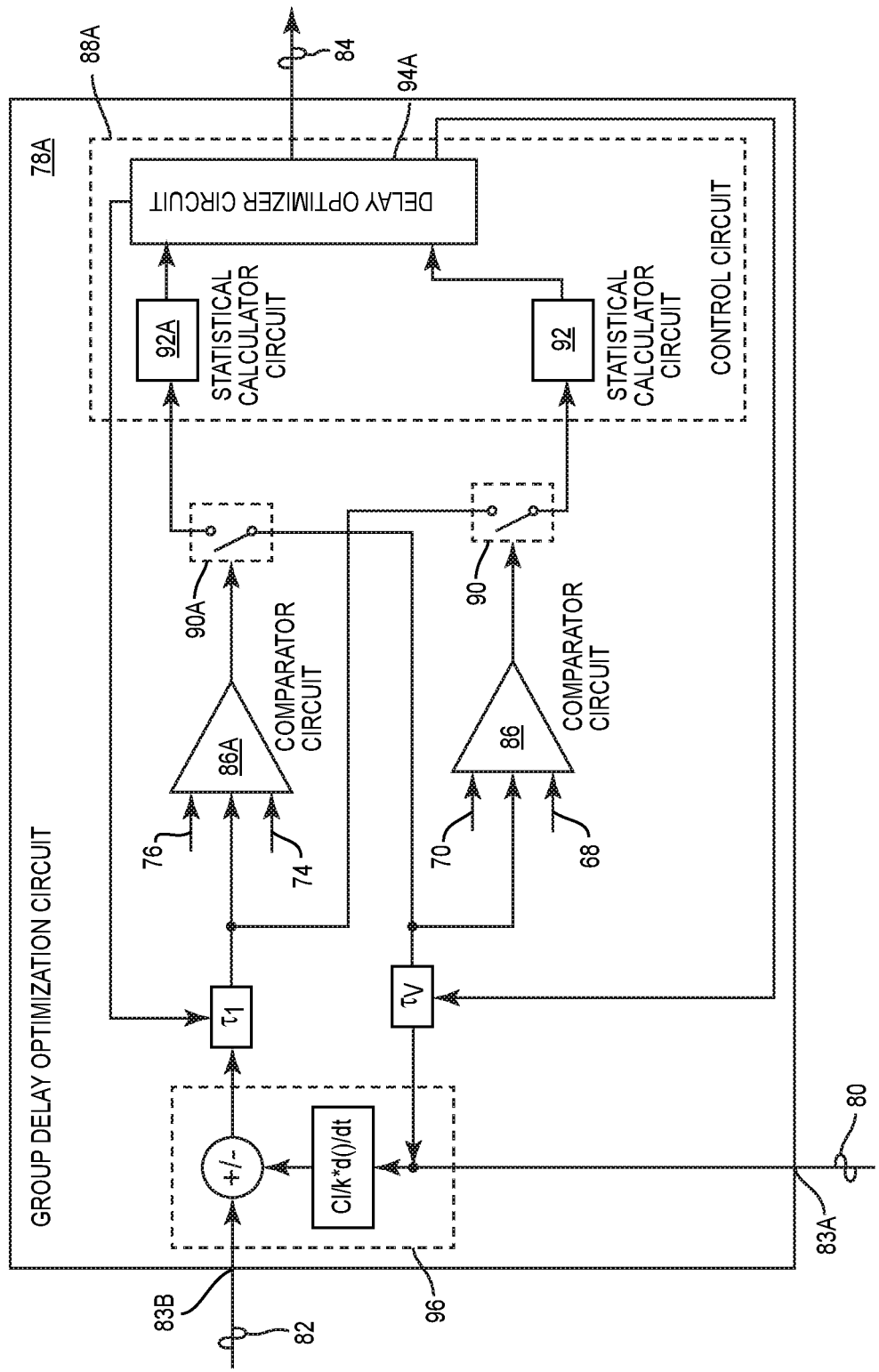
FIG. 4 is a schematic diagram of an exemplary group delay optimization circuit configured according to an alternative embodiment of the present disclosure.

FIG. 4 is a schematic diagram of an exemplary group delay optimization circuit 78A configured according to an alternative embodiment of the present disclosure. Common elements between FIGS. 3 and 4 are shown therein with common element numbers and will not be re-described herein.

The group delay optimization circuit 78A includes a second comparator circuit 86A. The group delay optimization circuit 78A also includes a control circuit 88A that further includes a second statistical calculator circuit 92A coupled to the second comparator circuit 86A via a second switch circuit 90A. In a non-limiting example, the comparator circuit 86 is configured to determine whether the current signal 82 falls within the current-related delay estimation window 66 and the second comparator circuit 86A is configured to determine whether the voltage signal 80 falls within the voltage-related delay estimation window 72.

When the comparator circuit 86 determines that the current signal 82 falls within the current-related delay estimation window 66, the comparator circuit 86 activates the statistical calculator circuit 92 to sample the voltage signal 80 and determine the voltage-related statistical indicator $\sigma_v$. Likewise, when the second comparator circuit 86A determines that the voltage signal 80 falls within the voltage-related delay estimation window 72, the second comparator circuit 86A activates the second statistical calculator circuit 92A to sample the current signal 82 and determine the current-related statistical indicator $\sigma_i$. The control circuit 88A includes a delay optimizer circuit 94A configured to perform the delay optimization cycles based on the voltage-related statistical indicator $\sigma_v$ and the current-related statistical indicator $\sigma_i$ to determine the optimized group delay offset between the voltage signal 80 and the current signal 82.

Figure 5:
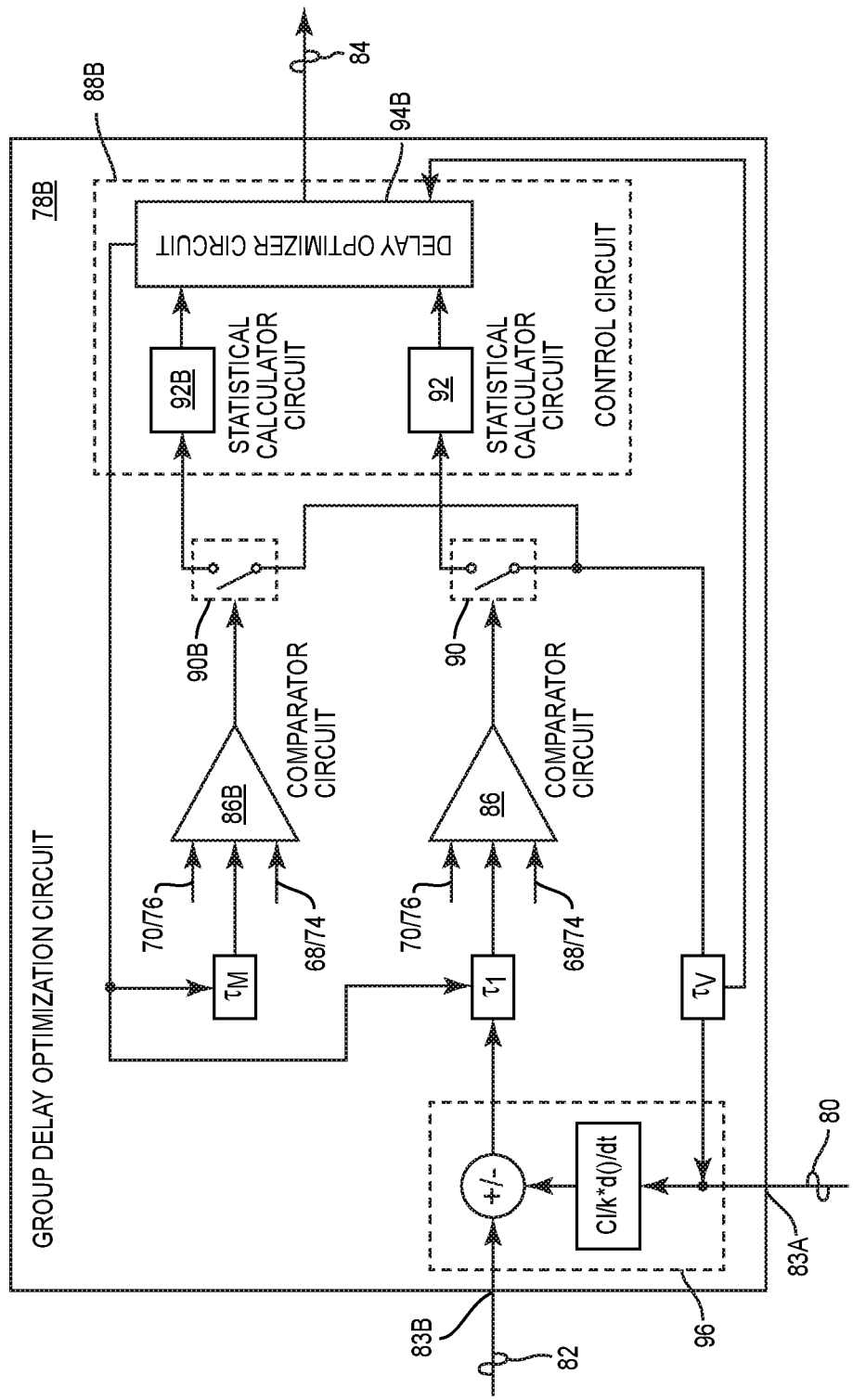
FIG. 5 is a schematic diagram of an exemplary group delay optimization circuit configured according to another alternative embodiment of the present disclosure.

FIG. 5 is a schematic diagram of an exemplary group delay optimization circuit 78B configured according to another alternative embodiment of the present disclosure. Common elements between FIGS. 3 and 5 are shown therein with common element numbers and will not be re-described herein.

The group delay optimization circuit 78B includes at least one second comparator circuit 86B. The group delay optimization circuit 78B also includes a control circuit 88B that further includes at least one second statistical calculator circuit 92B coupled to the second comparator circuit 86B via at least one second switch circuit 90B. The control circuit 88B also includes a delay optimizer circuit 94B.

In one embodiment, both the comparator circuit 86 and the second comparator circuit 86B are configured to determine whether the current signal 82 falls with the current-related delay estimation window 66. If the current signal 82 falls with the current-related delay estimation window 66, the comparator circuit 86 and the second comparator circuit 86B are configured to activate the statistical calculator circuit 92 and the second statistical calculator circuit 92B, respectively. The statistical calculator circuit 92 and the second statistical calculator circuit 92B may concurrently sample the voltage signal 80 to generate the voltage amplitude samples and determine the voltage-related statistical indicator $\sigma_v$. The delay optimizer circuit 94B may perform the delay optimization cycles to determine the optimized delay offset between the voltage signal 80 and the current signal 82. In a non-limiting example, the delay optimizer circuit 94 can adjust at least one second delay offset between the voltage signal 80 and the current signal 82 in each of the delay optimization cycles. In this regard, the group delay optimization circuit 78B may concurrently evaluate the voltage-related statistical indicator $\sigma_v$ based on multiple group delay offsets. As a result, it may be possible to reduce the number of delay optimization cycles.

In another embodiment, both the comparator circuit 86 and the second comparator circuit 86B are configured to determine whether the voltage signal 80 falls with the voltage-related delay estimation window 72. If the voltage signal 80 falls with the voltage-related delay estimation window 72, the comparator circuit 86 and the second comparator circuit 86B are configured to activate the statistical calculator circuit 92 and the second statistical calculator circuit 92B, respectively. The statistical calculator circuit 92 and the second statistical calculator circuit 92B may concurrently sample the current signal 82 to generate the current amplitude samples and determine the current-related statistical indicator $\sigma_i$. The delay optimizer circuit 94B may perform the delay optimization cycles to determine the optimized delay offset between the voltage signal 80 and the current signal 82. In a non-limiting example, the delay optimizer circuit 94 can adjust at least one second delay offset between the voltage signal 80 and the current signal 82 in each of the delay optimization cycles. In this regard, the group delay optimization circuit 78B may concurrently evaluate the voltage-related statistical indicator $\sigma_v$ based on multiple group delay offsets. As a result, it may be possible to reduce the number of delay optimization cycles.

Figure 6A:
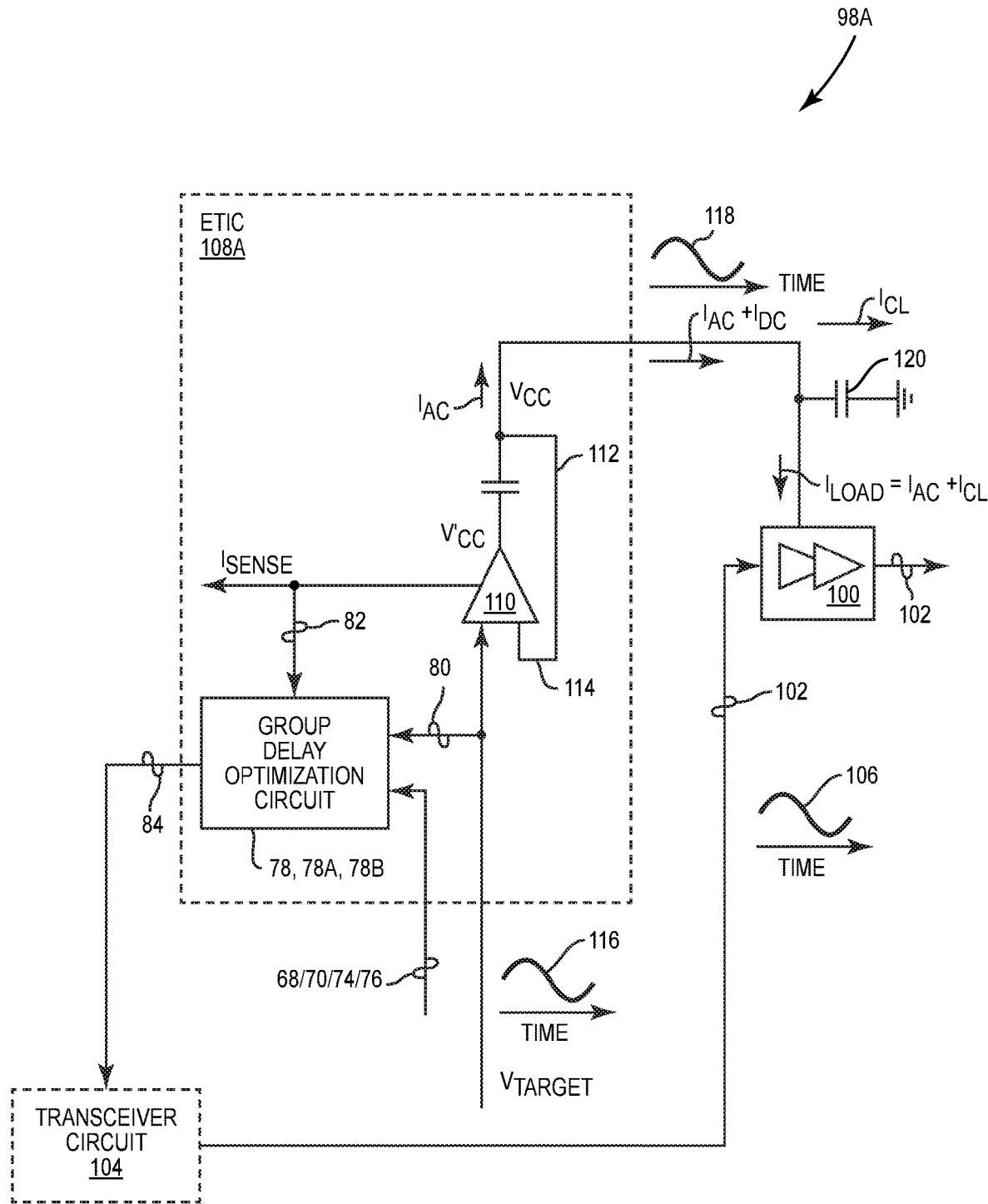
FIG. 6A is a schematic diagram of an exemplary ET apparatus configured according to an embodiment of the present disclosure to incorporate the group delay optimization circuit of FIGS. 3-5.

The group delay optimization circuit 78 of FIG. 3, the group delay optimization circuit 78A of FIG. 4, and the group delay optimization circuit 78B of FIG. 5 can be provided in an ET apparatus to help improve efficiency and/or linearity performance of an amplifier circuit(s). In this regard, FIG. 6A is a schematic diagram of an exemplary ET apparatus 98A configured according to an embodiment of the present disclosure to incorporate the group delay optimization circuit 78 of FIG. 3, the group delay optimization circuit 78A of FIG. 4, or the group delay optimization circuit 78B of FIG. 5. Common elements between FIGS. 3, 4, 5, and 6A are shown therein with common element numbers and will not be re-described herein.

The ET apparatus 98A includes an amplifier circuit 100 configured to amplify a signal 102 based on an ET voltage signal $V_{CC}$. The signal 102, which may be provided to the amplifier circuit 100 from a coupled transceiver circuit 104, corresponds to a time-variant signal envelope 106 similar to the time-variant signal envelope 26 in FIG. 1A.

The ET apparatus 98A includes an ET integrated circuit (ETIC) 108A configured to generate the ET voltage signal $V_{CC}$ based on an ET target voltage signal $V_{TARGET}$. In a non-limiting example, the ETIC 108A includes a voltage amplifier(s) 110 configured to generate an initial ET voltage signal $V'_{CC}$ based on the ET target voltage signal $V_{TARGET}$. The voltage amplifier(s) 110 may be coupled to an offset capacitor(s) 112 configured to convert the initial ET voltage signal $V'_{CC}$ to the ET voltage signal $V_{CC}$. The ETIC 108A may include a feedback loop 114 configured to provide a copy of the ET voltage signal $V_{CC}$ back to the voltage amplifier(s) 110. The ET target voltage signal $V_{TARGET}$ may correspond to a time-variant target voltage envelope 116, which is similar to the time-variant target voltage envelope 46 in FIG. 1A. Accordingly, the ETIC 108A is configured to generate the ET voltage signal $V_{CC}$ having a time-variant ET voltage envelope 118 that tracks the time-variant target voltage envelope 116.

Similar to the existing ET apparatus 10 of FIG. 1A, the ET apparatus 98A may cause the time-variant ET voltage envelope 118 to misalign with the time-variant signal envelope 106 at the amplifier circuit 100 due to similar reasons as previously described in FIGS. 1A-1C. Hence, it may be desired to minimize the group delay offset between the time-variant ET voltage envelope 118 and the time-variant signal envelope 106 in the ET apparatus 98A by incorporating the group delay optimization circuit 78 of FIG. 3, the group delay optimization circuit 78A of FIG. 4, or the group delay optimization circuit 78B of FIG. 5. Notably, the group delay optimization circuit 78, the group delay optimization circuit 78A, and the group delay optimization circuit 78B may be integrated into the ETIC 108A or coupled to the ETIC 108A externally.

Similar to the amplifier circuit 16 in FIG. 1A, the amplifier circuit 100 may appear to the ETIC 108A as a current source and induce a load current $I_{LOAD}$ in response to receiving the ET voltage signal $V_{CC}$. In case the time-variant signal envelope 106 corresponds to a higher PAR, the voltage amplifier(s) 110 in the ETIC 108A may be forced to source a current $I_{AC}$ such that the load current $I_{LOAD}$ can keep track of the time-variant signal envelope 106. In this regard, the current $I_{AC}$ may be proportionally related to the load current $I_{LOAD}$. Given that the load current $I_{LOAD}$ needs to rise and fall from time to time in accordance to the time-variant signal envelope 106 of the signal 102, the current $I_{AC}$ may likewise track the time-variant signal envelope 106 closely.

The voltage amplifier(s) 110 is configured to generate a sense current signal $I_{SENSE}$ indicative of the current $I_{AC}$ being sourced by the voltage amplifier(s) 110. In a non-limiting example, the sense current signal $I_{SENSE}$ is proportionally related to the current $I_{AC}$ and thus the load current $I_{LOAD}$. In this regard, the sense current signal $I_{SENSE}$ may also track the time-variant signal envelope 106 closely. As such, the sense current signal $I_{SENSE}$ may be provided to the group delay optimization circuit 78 as the current signal 82. In addition, the ET target voltage signal $V_{TARGET}$ (also referred to as "a selected voltage signal among the ET target voltage signal $V_{TARGET}$ and the ET voltage signal $V_{CC}$") may be provided to the group delay optimization circuit 78 as the voltage signal 80.

The amplifier circuit 100 may be coupled to a load capacitor 120, which can induce a capacitor current $I_{CL}$. In this regard, the load current $I_{LOAD}$ may include both the current $I_{AC}$ and the capacitor current $I_{CL}$ ($I_{LOAD}=I_{AC}+I_{CL}$). In this regard, the capacitor current $I_{CL}$ can become an unwanted signal. Thus, according to the discussion in FIG. 3, the current subtraction circuit 96 may be configured to subtract the capacitor current $I_{CL}$ from the sense current signal $I_{SENSE}$ prior to providing to the comparator circuit 86.

Figure 6B:
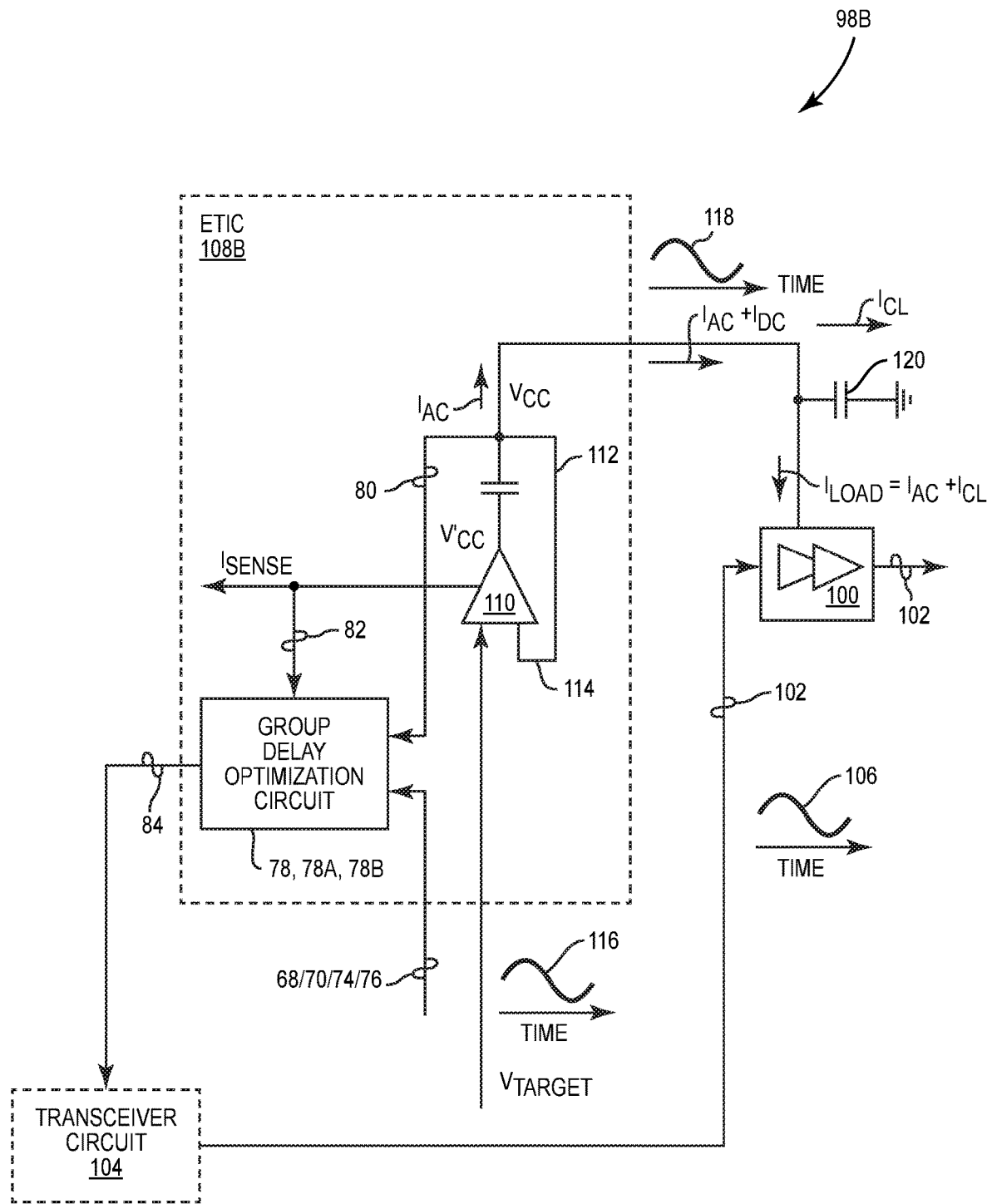
FIG. 6B is a schematic diagram of an exemplary ET apparatus configured according to another embodiment of the present disclosure to incorporate the group delay optimization circuit of FIGS. 3-5.

FIG. 6B is a schematic diagram of an exemplary ET apparatus 98B configured according to another embodiment of the present disclosure to incorporate the group delay optimization circuit 78 of FIG. 3, the group delay optimization circuit 78A of FIG. 4, or the group delay optimization circuit 78B of FIG. 5. Common elements between FIGS. 6A and 6B are shown therein with common element numbers and will not be re-described herein.

The ET apparatus 98B includes an ETIC 108B. The ET apparatus 98B differs from the ET apparatus 98A of FIG. 6A in that the group delay optimization circuit 78 is configured to receive the ET voltage signal $V_{CC}$ (also referred to as "a selected voltage signal among the ET target voltage signal $V_{TARGET}$ and the ET voltage signal $V_{CC}$") as the voltage signal 80.

Those skilled in the art will recognize improvements and modifications to the embodiments of the present disclosure. All such improvements and modifications are considered within the scope of the concepts disclosed herein and the claims that follow.

What is claimed is:

1. A group delay optimization circuit comprising:
    a first input node configured to receive a first signal;
    a second input node configured to receive a second signal; and
    a control circuit configured to:
        sample a first selected signal among the first signal and the second signal in a delay estimation window defined by a second selected signal among the first signal and the second signal to generate a plurality of amplitude samples of the first selected signal;
        determine a statistical indicator indicative of a distribution of the first selected signal in the delay estimation window based on the plurality of amplitude samples;
        determine a group delay offset between the first signal and the second signal based on the determined statistical indicator; and
        reduce the statistical indicator to below a defined threshold in one or more group delay optimization cycles to minimize the group delay offset between the first signal and the second signal.

2. The group delay optimization circuit of claim 1 wherein, in each of the one or more group delay optimization cycles, the control circuit is further configured to:
    adjust the group delay offset between the first signal and the second signal;
    re-sample the first selected signal to generate the plurality of amplitude samples of the first selected signal;
    re-determine the statistical indicator based on the plurality of amplitude samples; and
    compare the statistical indicator with the defined threshold to determine whether the statistical indicator is below the defined threshold.

3. The group delay optimization circuit of claim 1 wherein the statistical indicator is determined based on a statistical equation selected from the group consisting of: a first statistical equation expressed as $\Sigma_{i=1}^{N}(x_i-\mu)^2$, a second statistical equation expressed as $$\frac{1}{N}\sum_{i=1}^{N}(x_i - \mu)^2,$$

and a third statistical equation expressed as $$\sqrt{\frac{1}{N}\sum_{i=1}^{N}(x_i-\mu)^2},$$

wherein:
N represents a count of the plurality of amplitude samples;
$x_i$ represents any of the plurality of amplitude samples; and
μ represents a mean value of the plurality of amplitude samples.

4. The group delay optimization circuit of claim 1 wherein the first signal and the second signal correspond to a voltage signal and a current signal, respectively.

5. The group delay optimization circuit of claim 4 further comprising a comparator circuit configured to:
determine whether the second selected signal falls within the delay estimation window; and
activate the control circuit in response to the second selected signal falling within the delay estimation window.

6. The group delay optimization circuit of claim 5 further comprising a current subtraction circuit coupled to the comparator circuit and configured to subtract an unwanted current signal from the current signal prior to providing the current signal to the comparator circuit.

7. The group delay optimization circuit of claim 5 wherein:
the comparator circuit is further configured to:
determine whether the current signal falls within a current-related delay estimation window; and
activate the control circuit in response to the current signal falling within the current-related delay estimation window; and
the control circuit is further configured to:
sample the voltage signal in the current-related delay estimation window to generate a plurality of voltage amplitude samples;
determine a voltage-related statistical indicator indicative of the group delay offset based on the plurality of voltage amplitude samples; and
reduce the voltage-related statistical indicator to below the defined threshold in the one or more group delay optimization cycles to minimize the group delay offset.

8. The group delay optimization circuit of claim 5 wherein:
the comparator circuit is further configured to:
determine whether the voltage signal falls within a voltage-related delay estimation window; and
activate the control circuit in response to determining that the voltage signal falls within the voltage-related delay estimation window; and
the control circuit is further configured to:
sample the current signal in the voltage-related delay estimation window to generate a plurality of current amplitude samples;
determine a current-related statistical indicator indicative of the group delay offset based on the plurality of current amplitude samples; and
reduce the current-related statistical indicator to below the defined threshold in the one or more group delay optimization cycles to minimize the group delay offset.

9. The group delay optimization circuit of claim 5 further comprising a second comparator circuit, wherein:
the comparator circuit is further configured to determine whether the current signal falls within a current-related delay estimation window;
the second comparator circuit is configured to determine whether the voltage signal falls within a voltage-related delay estimation window; and
the control circuit is further configured to:
sample the voltage signal in the current-related delay estimation window to generate a plurality of voltage amplitude samples;
sample the current signal in the voltage-related delay estimation window to generate a plurality of current amplitude samples;
determine the statistical indicator indicative of the group delay offset based on the plurality of voltage amplitude samples and the plurality of current amplitude samples; and
reduce the statistical indicator to below the defined threshold in the one or more group delay optimization cycles to minimize the group delay offset.

10. The group delay optimization circuit of claim 5 further comprising at least one second comparator circuit configured to determine whether the current signal falls within the delay estimation window, wherein, in each of the one or more group delay optimization cycles, the control circuit is further configured to:
adjust at least one second group delay offset between the current signal and the voltage signal;
re-sample the first selected signal to generate a plurality of second amplitude samples;
re-determine the statistical indicator based on the plurality of amplitude samples and the plurality of second amplitude samples; and
compare the statistical indicator with the defined threshold to determine whether the statistical indicator is below the defined threshold.

11. An envelope tracking (ET) apparatus comprising:
an amplifier circuit configured to receive a signal corresponding to a time-variant signal envelope from a coupled transceiver circuit and amplify the signal based on an ET voltage signal;
an ET integrated circuit (ETIC) configured to:
generate the ET voltage signal based on an ET target voltage signal; and
generate a sense current signal corresponding to a time-variant current envelope proportionally related to the time-variant signal envelope; and
a group delay optimization circuit comprising:
a first input node configured to receive a selected voltage signal among the ET target voltage signal and the ET voltage signal;
a second input node configured to receive the sense current signal; and
a control circuit configured to:
sample a first selected signal among the sense current signal and the selected voltage signal in a delay estimation window defined by a second selected signal among the sense current signal and the selected voltage signal to generate a plurality of amplitude samples of the first selected signal;
determine a statistical indicator indicative of a distribution of the first selected signal in the delay estimation window based on the plurality of amplitude samples;

determine a group delay offset between the first signal and the second signal based on the determined statistical indicator; and reduce the statistical indicator to below a defined threshold in one or more group delay optimization cycles to minimize the group delay offset between the selected voltage signal and the sense current signal.

12. The ET apparatus of claim 11 wherein the second input node is further configured to receive the ET target voltage signal as the selected voltage signal.

13. The ET apparatus of claim 11 wherein the second input node is further configured to receive the ET voltage signal as the selected voltage signal.

14. The ET apparatus of claim 11 wherein, in each of the one or more group delay optimization cycles, the control circuit is further configured to:

adjust the group delay offset between the sense current signal and the selected voltage signal;

re-sample the first selected signal to generate the plurality of amplitude samples of the first selected signal;

re-determine the statistical indicator based on the plurality of amplitude samples; and compare the statistical indicator with the defined threshold to determine whether the statistical indicator is below the defined threshold.

15. The ET apparatus of claim 14 wherein the control circuit is further configured to provide the group delay offset causing the statistical indicator to be below the defined threshold to the coupled transceiver circuit.

16. The ET apparatus of claim 11 wherein the statistical indicator is determined based on a statistical equation selected from the group consisting of: a statistical equation expressed as $\Sigma_{i=1}^{N}(x_i-\mu)^2$, a statistical equation expressed as $$\frac{1}{N}\sum_{i=1}^{N}(x_i-\mu)^2,$$

and a statistical equation expressed as $$\sqrt{\frac{1}{N}\sum_{i=1}^{N}(x_i-\mu)^2},$$

wherein:

N represents a count of the plurality of amplitude samples;

$x_i$ represents any of the plurality of amplitude samples; and

μ represents a mean value of the plurality of amplitude samples.

17. The ET apparatus of claim 11 wherein the group delay optimization circuit further comprises a comparator circuit configured to:

determine whether the second selected signal falls within the delay estimation window; and activate the control circuit in response to determining that the second selected signal falls within the delay estimation window.

18. The ET apparatus of claim 17 wherein the group delay optimization circuit further comprises a current subtraction circuit coupled to the comparator circuit and configured to subtract an unwanted current signal from the sense current signal prior to providing the sense current signal to the comparator circuit.

19. The ET apparatus of claim 17 wherein:

the comparator circuit is further configured to:
 determine whether the sense current signal falls within a current-related delay estimation window; and
 activate the control circuit in response to determining that the sense current signal falls within the current-related delay estimation window; and the control circuit is further configured to:
 sample the selected voltage signal in the current-related delay estimation window to generate a plurality of voltage amplitude samples;
 determine a voltage-related statistical indicator indicative of the group delay offset based on the plurality of voltage amplitude samples; and
 reduce the voltage-related statistical indicator to below the defined threshold in the one or more group delay optimization cycles to minimize the group delay offset.

20. The ET apparatus of claim 17 wherein:

the comparator circuit is further configured to:
 determine whether the selected voltage signal falls within a voltage-related delay estimation window; and
 activate the control circuit in response to determining that the selected voltage signal falls within the voltage-related delay estimation window; and the control circuit is further configured to:
 sample the sense current signal in the voltage-related delay estimation window to generate a plurality of current amplitude samples;
 determine a current-related statistical indicator indicative of the group delay offset based on the plurality of current amplitude samples; and
 reduce the current-related statistical indicator to below the defined threshold in the one or more group delay optimization cycles to minimize the group delay offset.

* * * * *